(12) United States Patent
Cheng et al.

(10) Patent No.: US 11,177,304 B2
(45) Date of Patent: Nov. 16, 2021

(54) METHOD FOR FORMING LIGHT-SENSING DEVICE (71) Applicant: TAIWAN SEMICONDUCTOR MANUFACTURING CO., LTD., Hsinchu (TW)

(72) Inventors: Yun-Wei Cheng, Taipei (TW); Chun-Hao Chou, Tainan (TW); Kuo-Cheng Lee, Tainan (TW); Hsun-Ying Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/728,568

(22) Filed: Dec. 27, 2019

(65) Prior Publication Data

US 2020/0135787 A1 Apr. 30, 2020

Related U.S. Application Data (63) Continuation of application No. 15/683,900, filed on Aug. 23, 2017, now Pat. No. 10,522,580.

(51) Int. Cl.
*H01L 27/00* (2006.01)
*H01J 40/14* (2006.01)
*H01L 27/146* (2006.01)

(52) U.S. Cl.
CPC .. *H01L 27/14629* (2013.01); *H01L 27/14645* (2013.01); *H01L 27/14685* (2013.01);

(Continued)

(58) Field of Classification Search
CPC .......... H01L 27/1462; H01L 27/14629; H01L 27/14636; H01L 27/14685
See application file for complete search history.

(56) References Cited

U.S. PATENT DOCUMENTS 8,604,405 B2 * 12/2013 Liu ................... H01L 27/14685
250/208.1
9,385,152 B2 7/2016 Endo et al.
(Continued)

FOREIGN PATENT DOCUMENTS

TW 201126708 A1 8/2011

*Primary Examiner* — Bradley Smith
*Assistant Examiner* — David J Goodwin
(74) *Attorney, Agent, or Firm* — Birch, Stewart, Kolasch & Birch, LLP (57) ABSTRACT A method for forming a light-sensing device is provided. The method includes forming a light-sensing region in a semiconductor substrate. The semiconductor substrate has a front surface and a light-receiving surface opposite to the front surface. The method also includes forming a first dielectric layer over the front surface and forming a second dielectric layer over the first dielectric layer. The second dielectric layer has a different refractive index than that of the first dielectric layer, and the first dielectric layer and the second dielectric layer together form a (or a part of a) light-reflective element. The method further includes partially removing the first dielectric layer and the second dielectric layer to form a contact opening. In addition, the method includes forming a conductive contact to partially (or completely) fill the contact opening.

20 Claims, 10 Drawing Sheets

(52) U.S. Cl.
CPC ...... *H01L 27/1463* (2013.01); *H01L 27/1464* (2013.01); *H01L 27/14621* (2013.01); *H01L 27/14627* (2013.01); *H01L 27/14636* (2013.01)

(56) References Cited

U.S. PATENT DOCUMENTS

| | | |
|---|---|---|
| 9,437,635 B2 | 9/2016 | Soda |
| 2010/0243868 A1* | 9/2010 | Liu .................... H01L 27/1464 |
| | | 250/216 |
| 2011/0272727 A1 | 11/2011 | Su et al. |
| 2012/0050554 A1 | 3/2012 | Levine et al. |
| 2014/0197509 A1 | 7/2014 | Haddad et al. |
| 2016/0240718 A1 | 8/2016 | Giziewicz |
| 2017/0236863 A1 | 8/2017 | Liao et al. |
| 2017/0358621 A1 | 12/2017 | Jiang et al. |
| 2018/0175091 A1* | 6/2018 | Jeon ................. H01L 27/14645 |

* cited by examiner

METHOD FOR FORMING LIGHT-SENSING DEVICE

PRIORITY CLAIM AND CROSS-REFERENCE

This Application is a Divisional of U.S. application Ser. No. 15/683,900, filed on Aug. 23, 2017, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

Along with the advantages to be gained from reducing geometric size, improvements are being made directly to IC devices. One such IC device is the image sensor device. It is desirable for image sensor device to be formed with improved performance and reliability.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1:
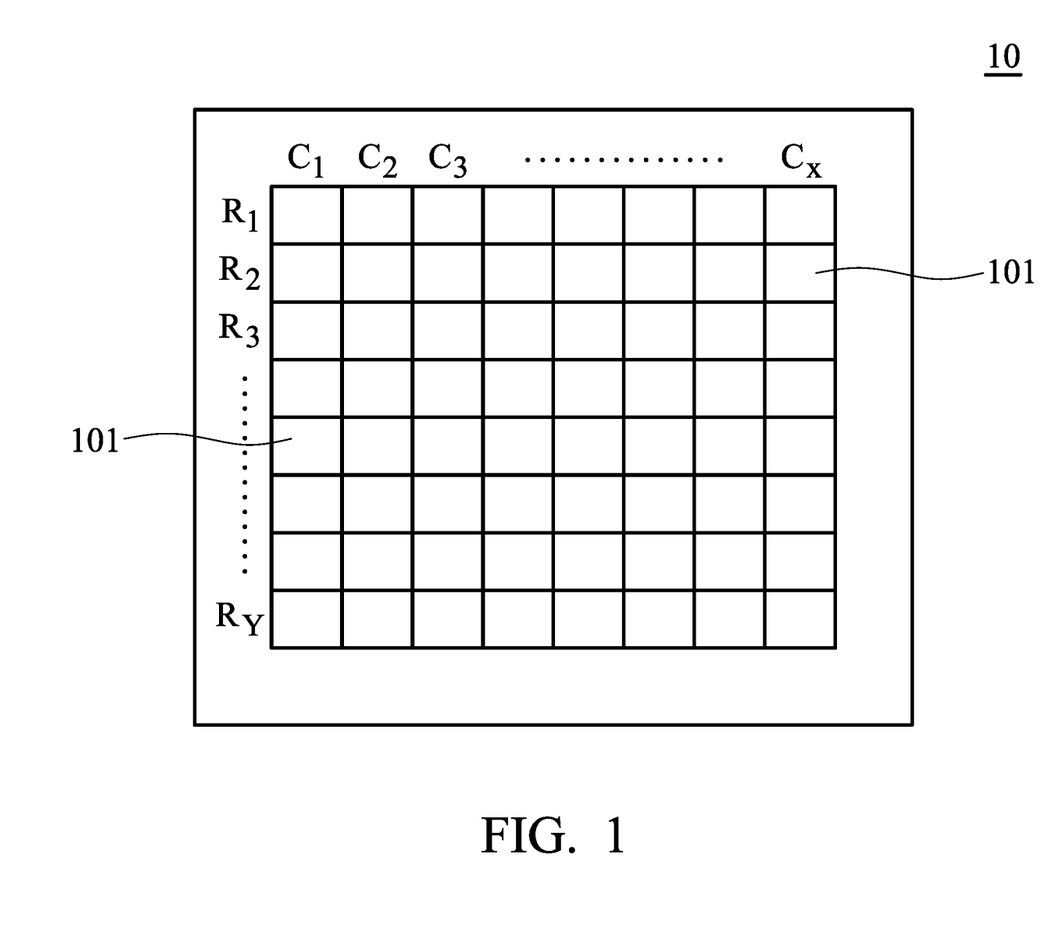
FIG. 1 is a top view of a light-sensing device, in accordance with some embodiments.

FIG. 1 is a top view of a light-sensing device 10, in accordance with some embodiments. The light-sensing device 10 may be a backside illuminated (BSI) image sensor device. However, it should be appreciated that embodiments of the disclosure are not limited to being a BSI image sensor device. In some other embodiments, the light-sensing device 10 is a front side illuminated (FSI) image sensor device. In some other embodiments, the light-sensing device 10 is used to sense invisible light (i.e., light that is outside the visible spectrum).

In some embodiments, the light-sensing device 10 includes an array of pixel regions 101. The pixel regions 101 may be arranged into columns (for example, C1 to CX) and rows (for example, R1 to RY). The term "pixel region" refers to a unit cell containing features such as a photodetector and various circuits. The unit cell may include various semiconductor devices for converting electromagnetic radiation into an electrical signal. The photodetectors (or light-sensing regions) in the pixel regions 101 may include photodiodes, complimentary metal-oxide-semiconductor (CMOS) image sensors, charged coupling device (CCD) sensors, active sensors, passive sensors, one or more other applicable sensors, or a combination thereof.

The pixel regions 101 may be designed with a single sensor type. Alternatively, the pixel regions 101 may be designed with various sensor types. One group of pixel regions 101 may be CMOS image sensors, and another group of pixel regions 101 may be other types of sensors, such as passive sensors. In some embodiments, each pixel region 101 includes a photodetector, such as a photogate-type photodetector, for recording intensity or brightness of light (radiation). Each pixel region 101 may also include various semiconductor devices, such as various transistors.

Additional circuitry, inputs, and/or outputs may be formed in a peripheral region or other suitable regions of the light-sensing device 10 and be coupled to the pixel regions 101. For example, the circuitry in the peripheral region provides an operation environment for the pixel regions 101 and support communications with the pixel regions 101.

Figure 2:
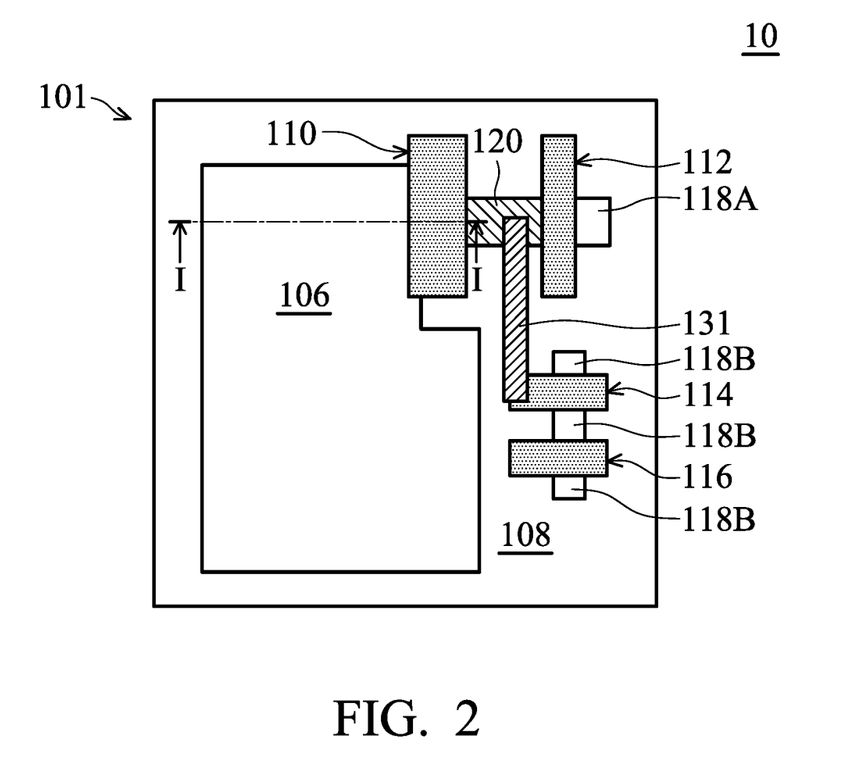
FIG. 2 is a top view of a pixel region of a light-sensing device, in accordance with some embodiments.

FIG. 2 is a top view of one of the pixel regions 101 of the light-sensing device 10, in accordance with some embodiments. As shown in FIG. 2, the pixel region 101 includes a light-sensing region 106. In some embodiments, the light-sensing region 106 is used for detecting intensity or brightness of light (radiation). The pixel region 101 may contain various transistors. For example, the transistors include a transfer transistor 110, a reset transistor 112, a source-follower transistor 114, a select transistor 116, one or more other suitable transistors, or a combination thereof.

The pixel region 101 may also include various doped regions in the semiconductor substrate, such as doped regions 118A, 118B, and 120. The doped regions 118A, 118B, and 120 serve as source/drain regions of the previously mentioned transistors. The doped region 120 is also referred to as a floating diffusion region in some embodiments. The doped region 120 is between the transfer transistor 110 and the reset transistor 112, and is one of the source/drain regions for the transfer transistor 110 and the reset transistor 112. In some embodiments, a conductive feature 131 overlaps a portion of a gate stack of the source-follower transistor 114 and connects to the doped region 120.

The light-sensing device 10 may also include various isolation structures 108 formed in the semiconductor substrate to isolate various regions of the semiconductor substrate. The isolation structures 108 prevent leakage currents between various regions. In some embodiments, the isolation structures 108 include dielectric isolation structures. The dielectric isolation structures may be formed by using a shallow trench isolation (STI) technique, a deep trench isolation (DTI) technique, one or more other applicable techniques, or a combination thereof.

In some embodiments, the isolation structures 108 may include doped isolation structures formed by an implantation technique or a diffusion technique. In some embodiments, the isolation structures 108 are formed in the pixel region 101 to isolate the light-sensing region 106, the transfer transistor 110, the reset transistor 112, the source-follower transistor 114, and the select transistor 116.

The light-sensing device 10 further includes a color filter and a lens disposed over a back surface of the semiconductor substrate in some embodiments. The color filter and the lens may be aligned with the light-sensing region 106. The lens is used to direct or focus the incident light. The color filter is designed so that it filters through light of a predetermined wavelength band. For example, the color filter may filter through visible light of a red wavelength band, a green wavelength band, a blue wavelength band, or a near-infrared wavelength band to the light-sensing region 106.

In the operation of the light-sensing device 10 according to some embodiments, the light-sensing device 10 is designed to receive radiation traveling towards the back surface of a semiconductor substrate of the light-sensing device 10. The lens disposed over the back surface of the semiconductor substrate directs the incident radiation to the corresponding light-sensing region 106 in the semiconductor substrate. The incident radiation may generate electron-hole pairs. When exposed to the incident radiation, the light-sensing region 106 responds to the incident radiation by accumulating electrons. The holes may be trapped by a doped layer over the back surface of the semiconductor substrate to prevent the recombination of the electrons and the holes.

The electrons are transferred from the light-sensing region 106 to the doped region 120 when the transfer transistor 110 is turned on. Through the connection of the conductive feature 131, the source-follower transistor 114 may convert the electrons from the doped region 120 to voltage signals. The select transistor 116 may allow a single row (or a single column) of the pixel array to be read by read-out electronics.

The reset transistor 112 may act as a switch to reset the doped region 120. When the reset transistor 112 is turned on, the doped region 120 is connected to a power supply to clear all accumulated electrons.

It should be appreciated that embodiments of the disclosure are not limited to being the light-sensing device 10 shown in FIG. 1 or 2. In some other embodiments, the light-sensing device 10 includes different configurations.

Figure 3A:
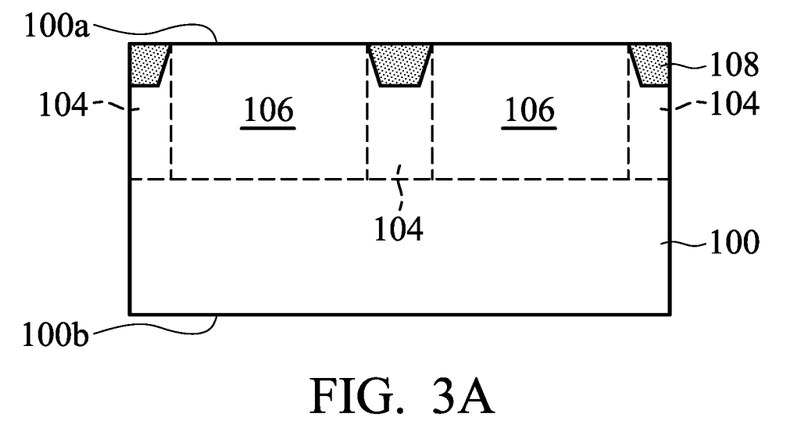
FIGS. 3A-3I are cross-sectional views of various stages of a process for forming a light-sensing device, in accordance with some embodiments.

FIGS. 3A-3I are cross-sectional views of various stages of a process for forming a light-sensing device, in accordance with some embodiments. Referring to FIG. 3A, a semiconductor substrate 100 is received or provided. The semiconductor substrate 100 has a front surface 100a and a back surface 100b. The front surface 100a is opposite to the back surface 100b. In some embodiments, the semiconductor substrate 100 is defined to mean a construction comprising one or more semiconductor materials. In some embodiments, the semiconductor substrate 100 includes a semiconductor wafer (such as a silicon wafer), or a portion of a semiconductor wafer. In some embodiments, the semiconductor substrate 100 includes an elementary semiconductor material in a single crystal, polycrystal, or amorphous structure. The elementary semiconductor material may include silicon, germanium, or another suitable material.

In some other embodiments, the semiconductor substrate 100 includes a compound semiconductor, such as silicon carbide, gallium arsenide, gallium phosphide, indium phosphide, indium arsenide, an alloy semiconductor, such as SiGe, GaAsP, AlInAs, AlGaAs, GaInAs, GaInP, GaInAsP, one or more other suitable materials, or a combination thereof.

In some embodiments, the semiconductor substrate 100 includes multi-layer semiconductors, a semiconductor on insulator (SOI) (such as silicon on insulator or germanium on insulator), or a combination thereof. In some embodiments, the semiconductor substrate 100 is a chip, such as a chip containing light-sensing devices.

As shown in FIG. 3A, the semiconductor substrate 100 includes one or more isolation structures 108, in accordance with some embodiments. The isolation structures 108 may define and/or isolate various device elements formed in the semiconductor substrate 100. The isolation structures 108 include shallow trench isolation (STI) features, deep trench isolation (DTI) features, local oxidation of silicon (LOCOS) features, other suitable isolation structures, or a combination thereof.

In some embodiments, the isolation structures 108 are made of or include silicon oxide, silicon nitride, silicon oxynitride, fluoride-doped silicate glass (FSG), a low-K dielectric material, one or more other suitable materials, or a combination thereof. In some embodiments, the formation of the isolation structure 108 includes patterning the semiconductor substrate 100 by a photolithography process, etching a recess, such as a trench, in the semiconductor substrate 100, and filling the recess with one or more dielectric materials. In some embodiments, the filled trench has a multi-layer structure, such as a thermal oxide liner layer filled with silicon nitride or silicon oxide.

Examples of the various device elements, which may be formed in the semiconductor substrate 100, include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field effect transistors (PFETs/NFETs), etc.), diodes, other applicable elements, or a combination thereof.

In some embodiments, similar to the embodiments shown in FIG. 2, the various device elements include the transfer transistor 110, the reset transistor 112, the source-follower transistor 114, the select transistor 116, one or more other suitable device elements, or a combination thereof. Various processes are performed to form the various device elements, which include, for example, deposition, photolithography, etching, implantation, annealing, planarization, and/or other suitable processes.

As shown in FIG. 3A, multiple light-sensing regions 106 are formed in the semiconductor substrate 100, in accordance with some embodiments. In some embodiments, each of the light-sensing regions 106 includes multiple doped regions, such as an n-type doped region and a p-type doped region. As shown in FIG. 3A, the isolation structures 108 separate the adjacent light-sensing regions 106. In some embodiments, each of the light-sensing regions 106 is formed by using ion implantation processes, diffusion processes, one or more other applicable processes, or a combination thereof.

As shown in FIG. 3A, isolation regions 104 are formed in the semiconductor substrate 100, in accordance with some embodiments. The isolation regions 104 may be used to electrically separate the adjacent light-sensing regions 106. In some embodiments, the isolation regions 104 are doped regions, such as (but not limited to) p-type doped regions. The isolation regions 104 may also refer to doped isolation regions. In some embodiments, the isolation regions 104 are formed by using ion implantation processes, diffusion processes, one or more other applicable processes, or a combination thereof. In some embodiments, the isolation regions 104 are formed before the isolation structures 108. In some other embodiments, the isolation regions 104 are formed after the isolation structures 108. In some embodiments, each of the isolation structures 108 is surrounded by one of the isolation regions 104.

As mentioned above, various transistors are formed, in accordance with some embodiments. FIGS. 4A-4E are cross-sectional view of intermediate stages of a process for forming a light-sensing device, in accordance with some embodiments. In some embodiments, FIGS. 4A-4E show cross-sectional views of intermediate stages taken along the line I-I in FIG. 2.

Figure 4A:
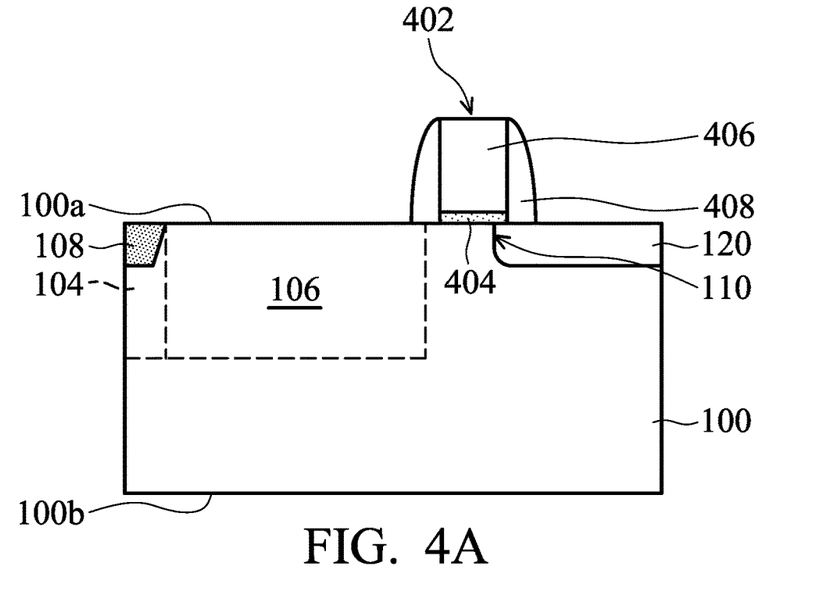
FIGS. 4A-4E are cross-sectional views of various stages of a process for forming a light-sensing device.

As shown in FIG. 4A, a gate stack 402 is formed over the front surface 100a of the semiconductor substrate 100, in accordance with some embodiments. In some embodiments, the gate stack 402 is a part of the transfer transistor 110 that is formed near the front surface 100a. In some embodiments, the gate stack 402 includes a gate dielectric layer 404 and a gate electrode 406. The gate dielectric layer 404 is made of or includes silicon oxide, high-k dielectric material, one or more other suitable materials, or a combination thereof. The gate electrode 406 may be a polysilicon electrode or a metal gate electrode. Spacer elements 408 may be formed on sidewalls of the gate stack 402. The transfer transistor 110 also includes the doped region 120 (or the floating diffusion region), as shown in FIGS. 2 and 4A.

Many variations and/or modifications can be made to embodiments of the disclosure. In some other embodiments, the gate stack 402 is a part of another kind of transistor other than a transfer transistor.

Figure 3B:
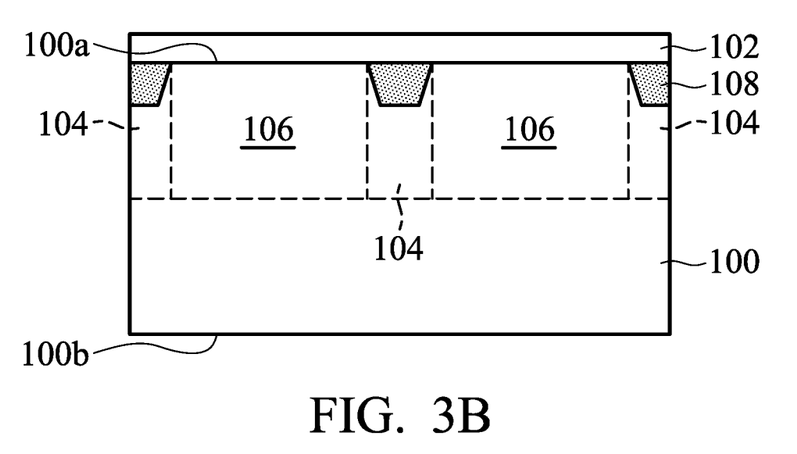
Figure 4B:
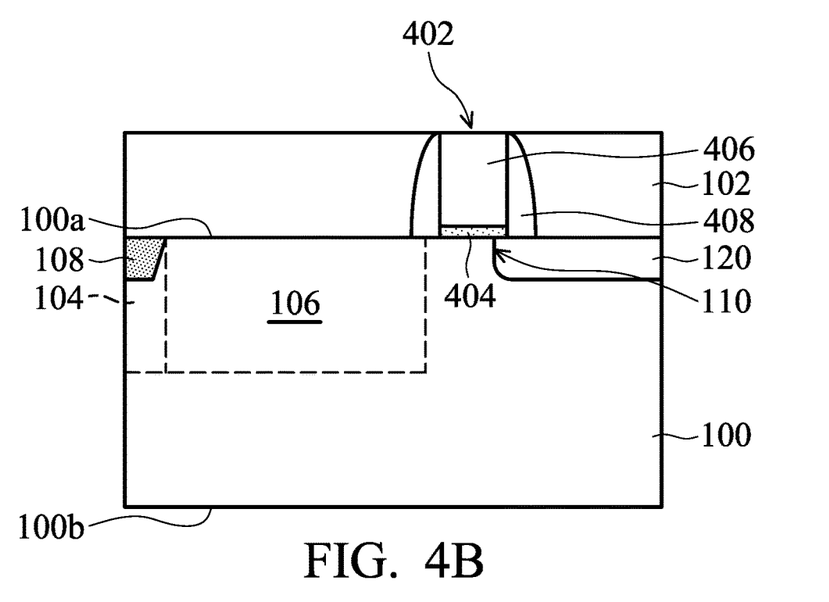

As shown in FIGS. 3B and 4B, a dielectric layer 102 is deposited over the front surface 100a of the semiconductor substrate 100, in accordance with some embodiments. The dielectric layer 102 may be made of or include silicon oxide, silicon oxynitride, tetraethylorthosilicate (TEOS) oxide, phosphosilicate glass (PSG), borophosphosilicate glass (BPSG), fluorinated silica glass (FSG), carbon doped silicon oxide, amorphous fluorinated carbon, low-k dielectric material, one or more other suitable materials, or a combination thereof. The low-k dielectric material may have a dielectric constant (k value) less than about 3.9 or less than about 2.8.

In some embodiments, a dielectric material layer is deposited over the front surface 100a to cover the gate stack 402. The dielectric material layer may be deposited using a chemical vapor deposition (CVD) process, an atomic layer deposition (ALD) process, a spin-on process, a spray coating process, a physical vapor deposition (PVD) process, one or more other applicable processes, or a combination thereof. In some embodiments, a planarization process is applied on the dielectric material layer. As a result, the dielectric layer 102 with a substantially planar top surface is formed. The planarization process may include a chemical mechanical polishing (CMP) process, a grinding process, a dry polishing process, an etching process, one or more other applicable processes, or a combination thereof.

In some embodiments, the planarization process is performed until the top surface of the gate stack 402 is exposed. In some embodiments, the gate stack 402 is a dummy gate stack. A gate replacement process may be used to form a metal gate stack. The gate dielectric layer 404 and/or the gate electrode 406 may be removed to leave a recess between the spacer elements 408. Afterwards, a gate dielectric layer, one or more work function layers, and/or a metal filling layer are formed in the recess to form a metal gate stack. In some embodiments, the top surface of the metal gate stack is substantially coplanar with the top surface of the dielectric layer 102. In some other embodiments, the metal gate stack fills a lower portion of the recess. A hard mask element may be formed on the metal gate stack to fill the recess. In some embodiments, the top surface of the hard mask element is substantially coplanar with the top surface of the dielectric layer 102.

Figure 3C:
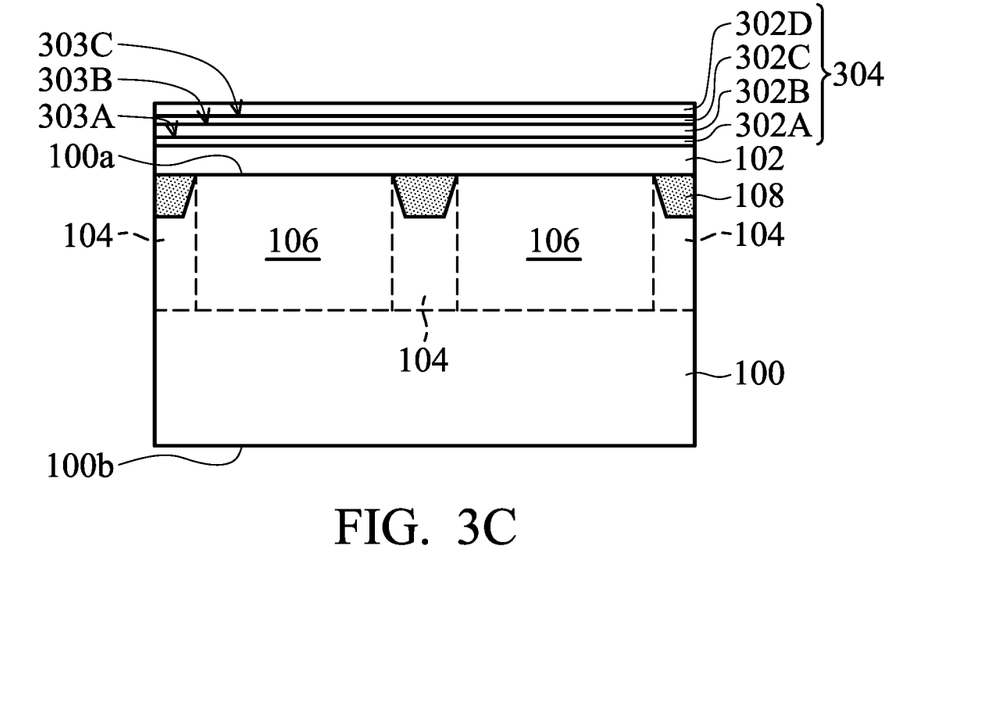
Figure 4C:
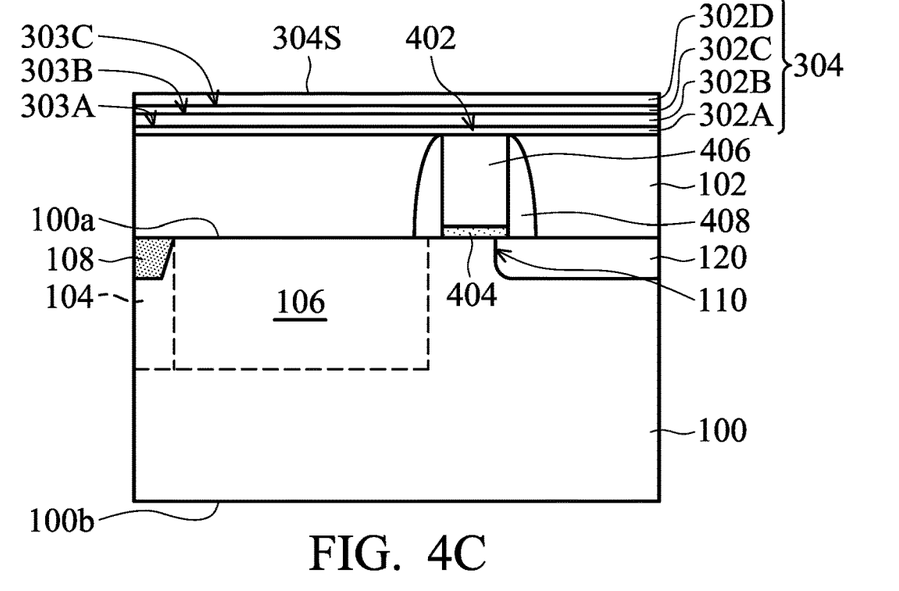

As shown in FIGS. 3C and 4C, a light-reflective element 304 is formed over the dielectric layer 102, in accordance with some embodiments. In some embodiments, the light-reflective element 304 substantially covers the front surface 100a of the semiconductor substrate 100. In some embodiments, the light-reflective element 304 is designed to be capable of reflecting light within a specific wavelength range. In some embodiments, the light-reflective element 304 is capable of reflecting a red light. In some embodiments, the light-reflective element 304 is capable of reflecting an invisible light. In some embodiments, the light-reflective element 304 is capable of reflecting an infrared (IR) light or a near IR light.

In some embodiments, the light-reflective element 304 is a distributed Bragg reflector (DBR). The DBR structure is a structure formed from multiple layers of alternating materials with varying refractive index, or by periodic variation of some characteristic (such as thickness), resulting in periodic variation in the effective refractive index. Each layer boundary causes a partial reflection. The many reflections may combine with constructive interference, and the layers may act as a high-quality reflector.

In some embodiments, the light-reflective element 304 includes a stack of multiple pairs of dielectric layers. In some embodiments, the light-reflective element 304 includes a first pair of dielectric layers including dielectric layers 302A and 302B. The light-reflective element 304 also includes a second pair of dielectric layers including dielectric layers 302C and 302D.

In some embodiments, the dielectric layers are multiple layers of alternating materials with varying refractive index.

In some embodiments, the dielectric layer 302A has a different refractive index than that of the dielectric layer 302B. In some embodiments, the dielectric layer 302A has a greater refractive index than that of the dielectric layer 302B. In some embodiments, the dielectric layer 302A has a greater refractive index than that of the dielectric layer 102.

In some embodiments, the dielectric layer 302A has a different thickness than that of the dielectric layer 302B. In some embodiments, the dielectric layer 302A that has a greater refractive index is thinner than the dielectric layer 302B that has a smaller refractive index. However, embodiments of the disclosure are not limited thereto. In some other embodiments, the dielectric layer 302A is substantially as thick as the dielectric layer 302B.

In some embodiments, the second pair of dielectric layers is similar to or the same as the first pair of dielectric layers. In some embodiments, the dielectric layer 302C has a different refractive index than that of the dielectric layer 302D. In some embodiments, the dielectric layer 302C has a greater refractive index than that of the dielectric layer 302D.

In some embodiments, the dielectric layer 302C has a different thickness than that of the dielectric layer 302D. In some embodiments, the dielectric layer 302C that has a greater refractive index is thinner than the dielectric layer 302D that has a smaller refractive index. In some embodiments, the thickness is adjusted according to wavelength of the light intended to be sensed. In some embodiments, each of the dielectric layers has a thickness that is substantially equal to a quarter of a ratio of the wavelength to the refractive index. However, embodiments of the disclosure are not limited thereto. In some other embodiments, the dielectric layer 302C is substantially as thick as the dielectric layer 302D.

In some embodiments, the dielectric layer 302C has a refractive index that is substantially the same as that of the dielectric layer 302A. In some embodiments, the dielectric layers 302A and 302C are made of the same material. In some embodiments, the dielectric layer 302D has a refractive index that is substantially the same as that of the dielectric layer 302B. In some embodiments, the dielectric layers 302B and 302D are made of the same material which is different from that of the dielectric layer 302A or 302C.

In some embodiments, the dielectric layers 302A and 302C are made of or include a carbon-containing material. The carbon-containing material may include silicon carbide, silicon carbon nitride, one or more other suitable materials, or a combination thereof. In some embodiments, the dielectric layers 302B and 302D are made of or include an oxide material. The oxide material may include silicon oxide, silicon oxynitride, one or more other suitable materials, or a combination thereof.

In some embodiments, the dielectric layer 302A is in direct contact with the dielectric layer 302B. In some embodiments, the dielectric layer 302C is in direct contact with the dielectric layer 302D. In some embodiments, an interface 303A between the dielectric layers 302A and 302B is substantially parallel to the front surface 100a and/or the back surface 100b. In some embodiments, the back surface 100b is used as a light-receiving surface. An incident light may enter the semiconductor substrate 100 from the back surface 100b and then be sensed by the light-sensing region 106.

In some embodiments, an interface 303B between the dielectric layers 302B and 302C and/or an interface 303C between the dielectric layers 302C and 302D are/is substantially parallel to the interface 303A. Therefore, the interface 303B or 303C may also be substantially parallel to the back surface (or the light-receiving surface) 100b of the semiconductor substrate 100.

In some embodiments, the light-reflective element 304 is formed by sequentially depositing the dielectric layers 302A-302D. In some embodiments, each of the dielectric layers 302A-302D is deposited using a CVD process, an ALD process, a spin-on process, a PVD process, a spray coating process, one or more other applicable processes, or a combination thereof. In some embodiments, the dielectric layers 302A-302D are sequentially deposited in the same processing chamber. Reaction gases may be varied during the formation of the light-reflective element 304. As a result, various layers with different materials and/or thicknesses are formed. In some other embodiments, the dielectric layers 302A-302D are sequentially deposited in different processing chambers. For example, after the formation of the dielectric layer 302A, the semiconductor substrate 100 is transferred into another processing chamber for the subsequent formation of the dielectric layer 302B.

Figure 4D:
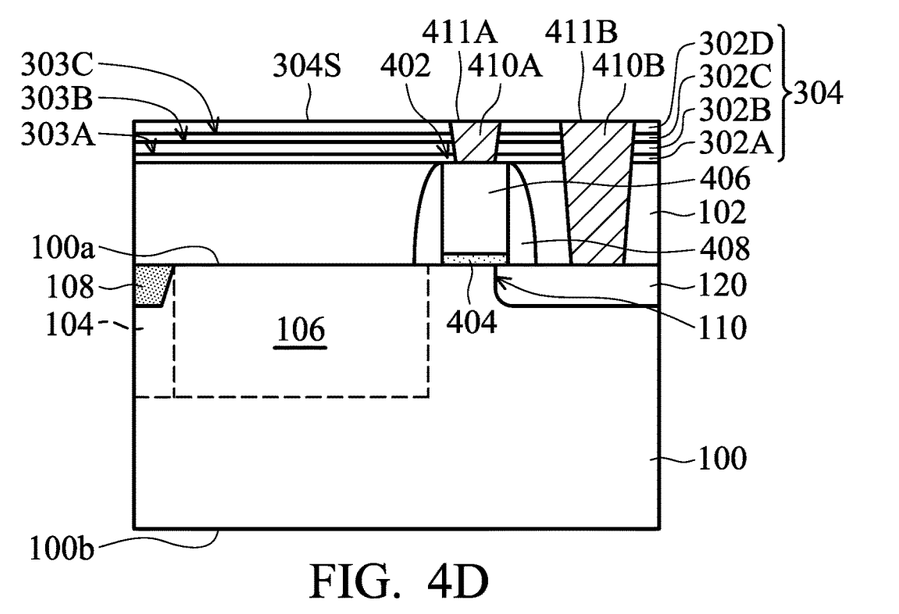

Afterwards, a conductive contact is formed to be electrically connected to the transistor 110, as shown in FIG. 4D in accordance with some embodiments. In some embodiments, portions of the light-reflective element 304 and the dielectric layer 102 are removed. One or more photolithography processes and etching process may be used to form contact openings that expose the gate electrode 406 and/or the doped region 120. In some embodiments, conductive contacts 410A and 410B are formed in the contact openings. In some embodiments, the conductive contact 410A completely penetrates through the dielectric layers 302A-302D and is electrically connected to the gate electrode 406 of the gate stack 402. In some embodiments, the conductive contact 410B completely penetrates through the dielectric layers 302A-302D and is electrically connected to the doped region 120 (or the source/drain feature) of the transistor 110.

In some embodiments, one or more conductive materials are deposited over the light-reflective element 304 to fill the contact openings. Afterwards, a planarization process is performed to remove the conductive materials outside of the contact openings until the light-reflective element 304 is exposed. The remaining portions of the conductive materials in the contact openings form the conductive contacts such as the conductive contacts 410A and 410B. In some embodiments, the top surface 411A of the conductive contact 410A or the top surface 411B of the conductive contact 410B is substantially coplanar with a surface 304S of the light-reflective element 304.

The one or more conductive materials may include copper, tungsten, aluminum, gold, platinum, titanium, cobalt, one or more other suitable materials, or a combination thereof. The one or more conductive materials may be deposited using a CVD process, a PVD process, an electroplating process, an electroless plating process, one or more applicable processes, or a combination thereof.

Figure 3D:
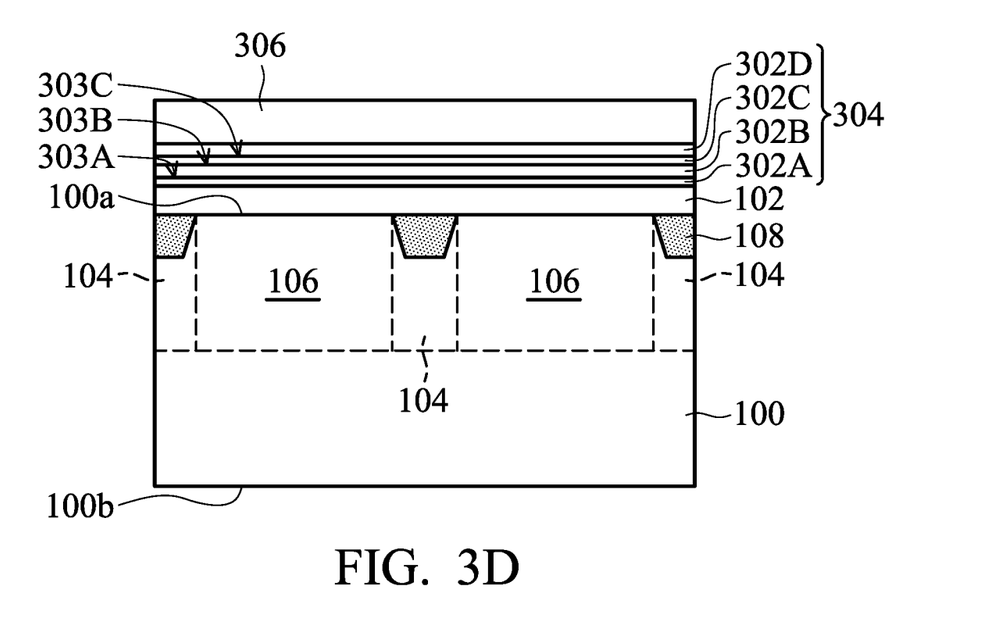
Figure 4E:
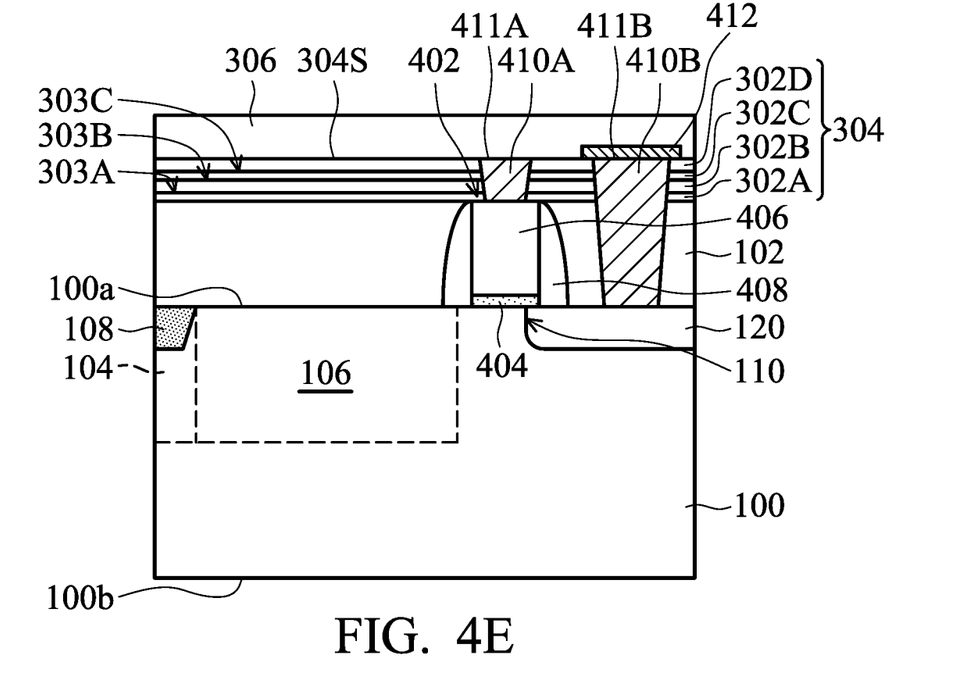

As shown in FIGS. 3D and 4E, an interconnect structure 306 is formed over the light-reflective element 304 and the conductive contacts 411A and 411B, in accordance with some embodiments. In some embodiments, the interconnect structure 306 includes a stack of multiple dielectric layers. The interconnect structure 306 also includes various conductive features. The conductive features include, for example, multiple horizontal interconnects, such as conductive lines, and multiple vertical interconnects, such as conductive via plugs and/or conductive contact plugs. The conductive features of the interconnect structure 306 form electrical connections to the device elements formed in or on the semiconductor substrate 100. The device element may be a doped region formed in or over the semiconductor substrate 100. Alternatively, the device element may be a gate electrode formed over or in the semiconductor substrate 100. In some embodiments, one of the conductive features, such as a conductive line 412, is electrically connected to the conductive contact 410B, as shown in FIG. 4E.

In some embodiments, the various device elements are interconnected to form an integrated circuit device through the conductive features in the interconnect structure 306. The integrated circuit device includes, for example, a light-sensing device, a logic device, a memory device (such as static random access memory (SRAM) and/or dynamic static random access memory (DRAM)), radio frequency (RF) device, input/output (I/O) device, system-on-chip (SoC) device, other applicable devices, or a combination thereof.

In some embodiments, the multiple dielectric layers of the interconnect structure 306 are made of or include silicon oxide, silicon nitride, silicon oxynitride, tetraethylorthosilicate (TEOS) oxide, phosphosilicate glass (PSG), borophosphosilicate glass (BPSG), fluorinated silica glass (FSG), carbon doped silicon oxide, amorphous fluorinated carbon, low-k dielectric material, one or more other suitable materials, or a combination thereof. The low-k dielectric material may have a dielectric constant (k value) less than about 3.9 or less than about 2.8. In some embodiments, the conductive features of the interconnect structure 306 are made of or include copper, aluminum, tungsten, cobalt, titanium, nickel, gold, platinum, other suitable materials, or a combination thereof. The formation of the interconnect structure 306 may involve multiple deposition processes, photolithography processes, etching processes, planarization processes, one or more other applicable processes, or a combination thereof.

Figure 3E:
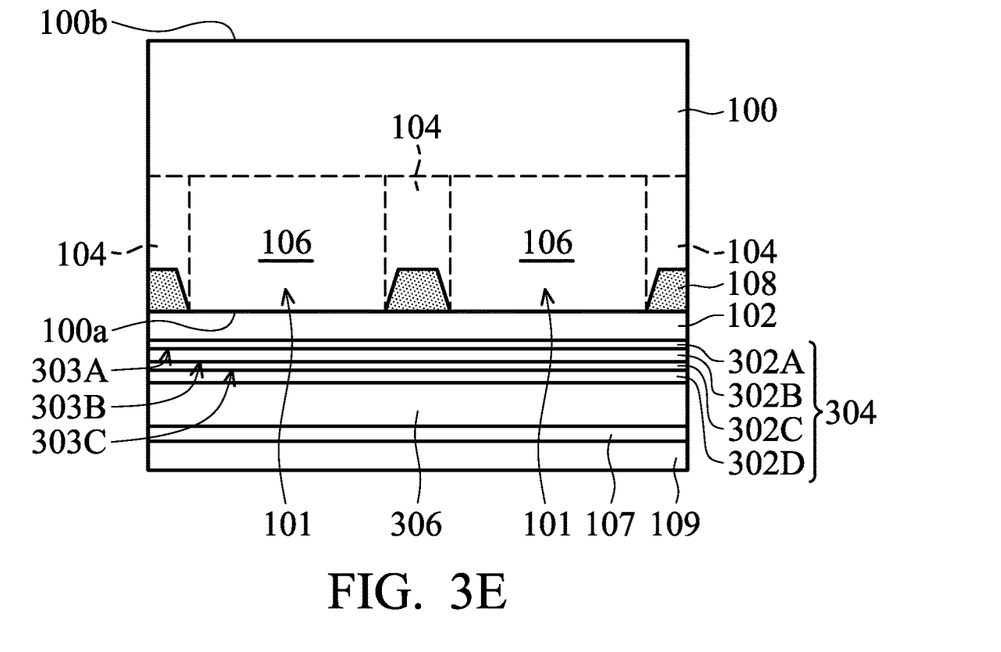

As shown in FIG. 3E, the structure shown in FIG. 3D is bonded onto a carrier substrate 109, in accordance with some embodiments. In some embodiments, an adhesion layer 107 is used to bond the interconnect structure 306 with the carrier substrate 109. In some embodiments, the carrier substrate 109 is made of or includes a semiconductor material, a dielectric material, a metal material, one or more other suitable materials, or a combination thereof. In some embodiments, the adhesion layer 107 is not formed. The carrier substrate 109 is directly bonded onto the interconnect structure 306. In some other embodiments, the carrier substrate 109 is a semiconductor wafer that contains multiple active devices and/or passive devices.

Figure 3F:
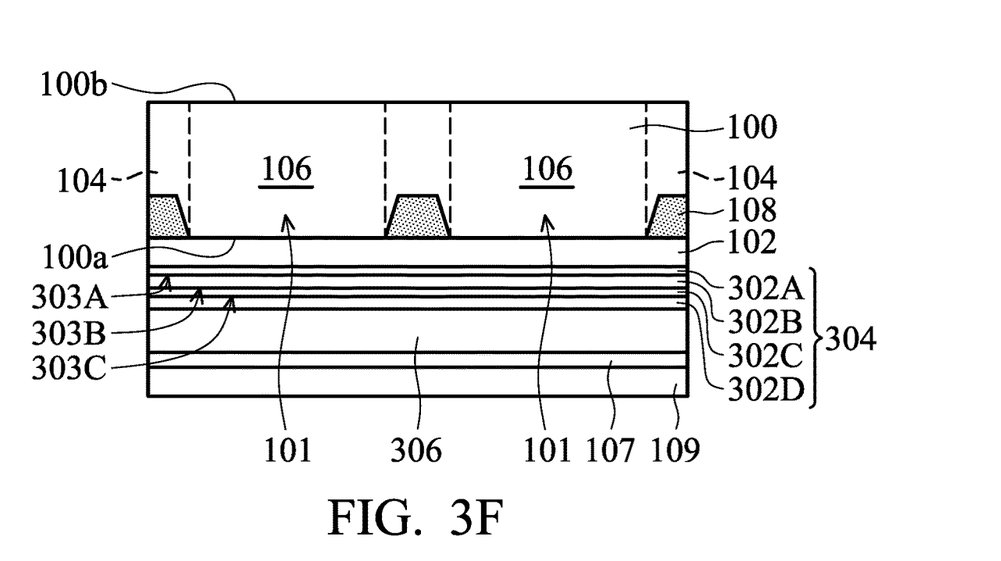

As shown in FIG. 3F, the semiconductor substrate 100 is thinned, in accordance with some embodiments. In some embodiments, the carrier substrate 109 is used as a support, and a thinning process is applied on the back surface 100b of the semiconductor substrate 100 to thin the semiconductor substrate 100. In some embodiments, the thinning process includes a chemical mechanical polishing (CMP) process, a grinding process, an etching process, a dry polishing process, one or more other applicable processes, or a combination thereof. The structure shown in FIG. 3F may be used as a backside illuminated (BSI) image sensor device or a backside illuminated light-sensing device. After the thinning process, the back surface 100b may be used as a light-receiving surface.

However, many variations and/or modifications can be made to embodiments of the disclosure. In some other embodiments, the semiconductor substrate 100 is not thinned. In some embodiments, the carrier substrate 109 is not bonded with the interconnect structure 306.

Many variations and/or modifications can be made to embodiments of the disclosure. In some embodiments, portions of the isolation regions 104 are removed from the back surface 100b to form trenches after the thinning of the semiconductor substrate 100. Afterwards, isolation features (such as DTI features) are formed in the trenches to improve electrical isolation between the neighboring light-sensing regions 106.

Figure 3G:
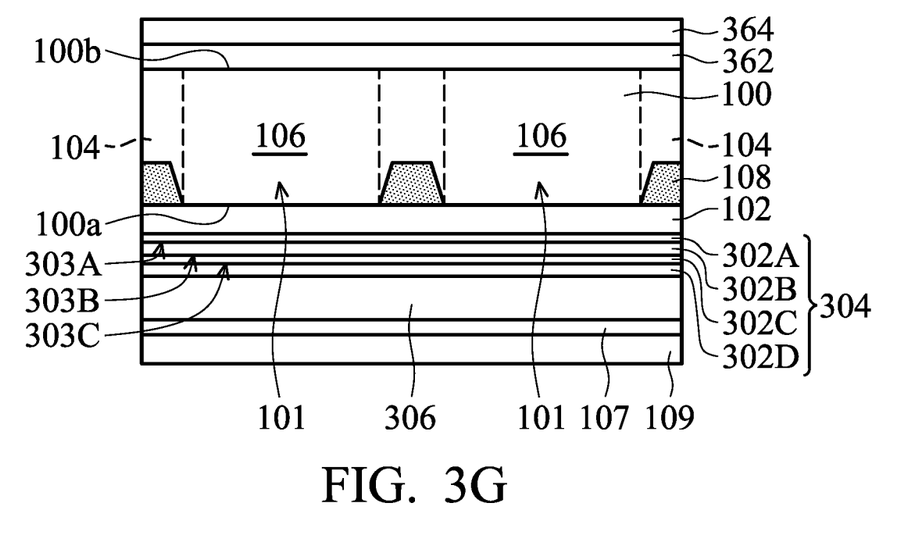

As shown in FIG. 3G, an anti-reflection coating (ARC) layer 362 and a buffer layer 364 are formed over the back surface 100b of the semiconductor substrate 100, in accordance with some embodiments. The ARC layer 362 may be used to reduce optical reflection from the back surface 100b of the semiconductor substrate 100 to ensure that most of an incident light enters the light-sensing regions 106 and is sensed.

The ARC layer 362 may be made of or include a high-k material, a dielectric material, one or more other suitable materials, or a combination thereof. The high-k material may include hafnium oxide, tantalum oxide, zirconium oxide, aluminum oxide, one or more other suitable materials, or a combination thereof. The dielectric material includes, for example, silicon nitride, silicon oxynitride, one or more other suitable materials, or a combination thereof.

The buffer layer 364 may be used as a buffer between the ARC layer 362 and an overlying layer subsequently formed. The buffer layer 364 may be made of a dielectric material or one or more other suitable materials. For example, the buffer layer 364 is made of or includes silicon oxide, silicon nitride, silicon oxynitride, one or more other suitable materials, or a combination thereof.

The ARC layer 362 and the buffer layer 364 may together be used as a planarization layer to facilitate subsequent processing. The ARC layer 362 and the buffer layer 364 may be deposited sequentially over the semiconductor substrate 100 using a chemical vapor deposition (CVD) process, a spin-on process, a physical vapor deposition (PVD) process, one or more other applicable processes, or a combination thereof.

Many variations and/or modifications can be made to embodiments of the disclosure. In some embodiments, the ARC layer 362 is not formed. In some other embodiments, the buffer layer 364 is not formed. In some other embodiments, both the ARC layer 362 and the buffer layer 364 are not formed.

Figure 3H:
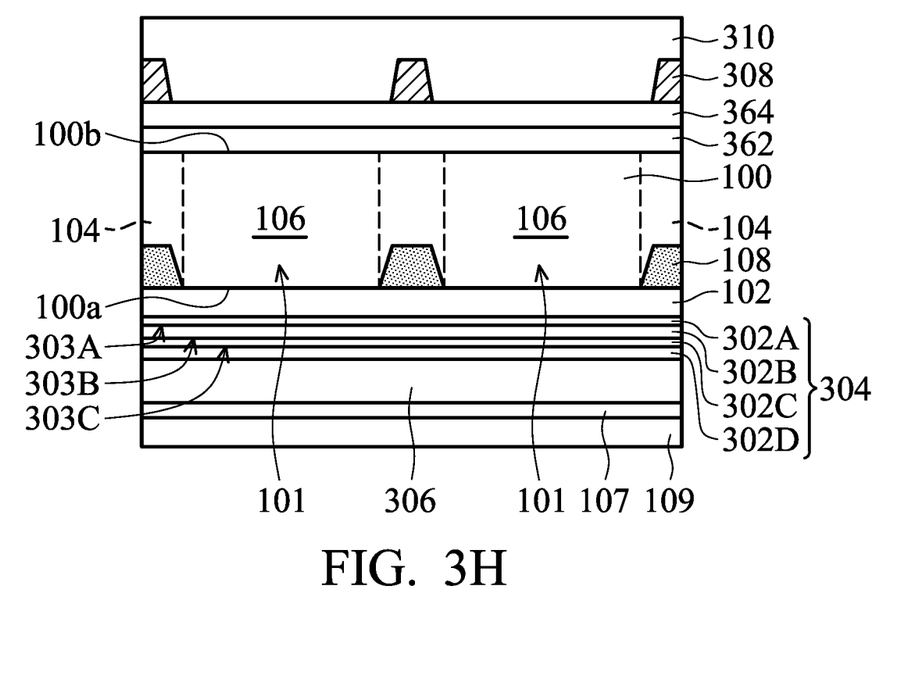

As shown in FIG. 3H, a reflective grid 308 is formed over the buffer layer 364, in accordance with some embodiments. The reflective grid 308 may be used to reflect an incident light. The reflective grid 308 may define multiple recesses. Each of the recesses may be aligned with a corresponding light-sensing region 106. In some embodiments, the reflective grid 308 is made of or includes a metal material. In some embodiments, the reflective grid 308 is made of or includes aluminum, silver, copper, titanium, gold, platinum, tungsten, cobalt, tantalum, tantalum nitride, one or more other suitable materials, or a combination thereof.

In some embodiments, one or more metal material layers are deposited over the buffer layer 364 and then patterned to form the reflective grid 308. The one or more metal material layers may be deposited using a PVD process, an electroplating process, a CVD process, an electroless plating process, one or more other applicable processes, or a combination thereof.

Afterwards, a dielectric layer 310 is deposited over the reflective grid 308 to overfill the recesses defined by the reflective grid 308, as shown in FIG. 3H in accordance with some embodiments. In some embodiments, the dielectric layer 310 is in direct contact with the reflective grid 308. However, in some other embodiments, the dielectric layer 310 is not in direct contact with the reflective grid 308. One or more other material layers may be formed between the reflective grid 308 and the dielectric layer 310.

In some embodiments, the dielectric layer 310 is a transparent layer. In some embodiments, the dielectric layer 310 is made of or includes silicon oxide, silicon nitride, silicon oxynitride, one or more other suitable materials, or a combination thereof. The dielectric layer 310 may be deposited using a CVD process, a spin-on process, a PVD process, one or more other applicable processes, or a combination thereof.

Figure 3I:
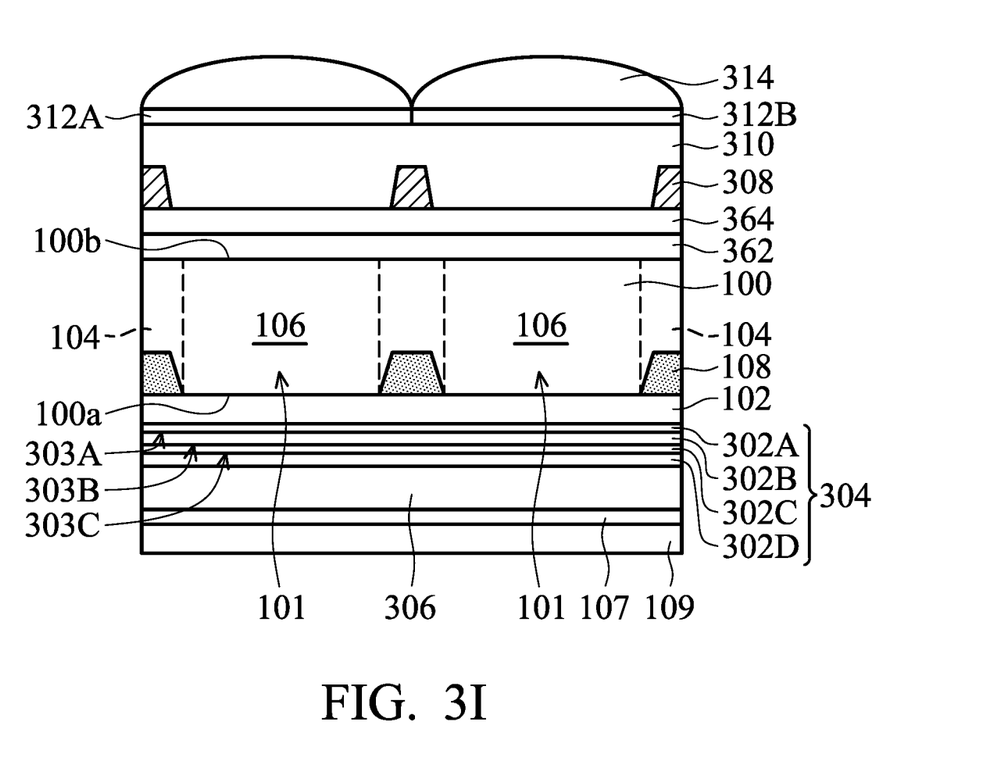

As shown in FIG. 3I, filter elements 312A and 312B are formed over the dielectric layer 310, in accordance with some embodiments. In some embodiments, the filter elements 312A and 312B are correspondingly aligned with the light-sensing regions 106, as shown in FIG. 3I. The filter elements 312A and 312B may be color filter elements. In some embodiments, the neighboring filter elements 312A and 312B may have different colors. The filter elements 312A and 312B may be made of or include a dye-based polymer (or a pigment-based polymer).

In some embodiments, a filter film is formed over the dielectric layer 310 using a spin-on process, a spray coating process, one or more other applicable processes, or a combination thereof. The filter film may also be a photosensitive layer or a photoresist layer. Therefore, exposure and development operations may then be performed to pattern the filter film. As a result, the filter element 312A is formed. Similarly, the filter element 312B with a different color may be formed sequentially using similar methods. In some embodiments, a thermal operation is used to assist in the formation of the filter elements 312A and 312B.

As shown in FIG. 3I, lens elements 314 are respectively formed over the filter elements 312A and 312B, in accordance with some embodiments. Each of the lens elements 314 is aligned with a corresponding light-sensing region 106. The lens elements 314 are used to direct the incident light to the corresponding light-sensing region 106 through the corresponding filter elements such as the filter elements 312A or 312B. The reflective grid 308 may also be used to concentrate the filtered incident light to the corresponding light-sensing region 106.

In some embodiments, the light-sensing regions 106 have relatively small absorption coefficient for red light or invisible light (such as near infrared light) with a longer wavelength. As a result, red light may have the lower quantum efficiency (QE) than other colors such as green or blue. For low light or dark environment applications using near IR sensing, the corresponding quantum efficiency (QE) may be even lower since the wavelength is longer than that of red light. In some cases, although the thickness of the semiconductor substrate 100 may be increased to provide longer absorption depth to improve the absorption of the red light or near IR light, the difficulty of the process may increase. The quantum efficiency (QE) of other colors may also be negatively affected.

In some embodiments, due to the light-reflective element 304, light with a specific wavelength range (such as red light or near IR light) is reflected and sensed again by the corresponding light sensing element 106. Therefore, the quantum efficiency (QE) for light with longer wavelength is significantly improved. Because the light-reflective element 304 covers an entirety of the light-sensing regions 106, more reflected light is sensed again by the corresponding light-sensing region 106. The performance of the light-sensing device is improved.

Many variations and/or modifications can be made to embodiments of the disclosure. Some variations and/or modifications may be made to the light-reflective element 304, in accordance with some embodiments.

Figure 5:
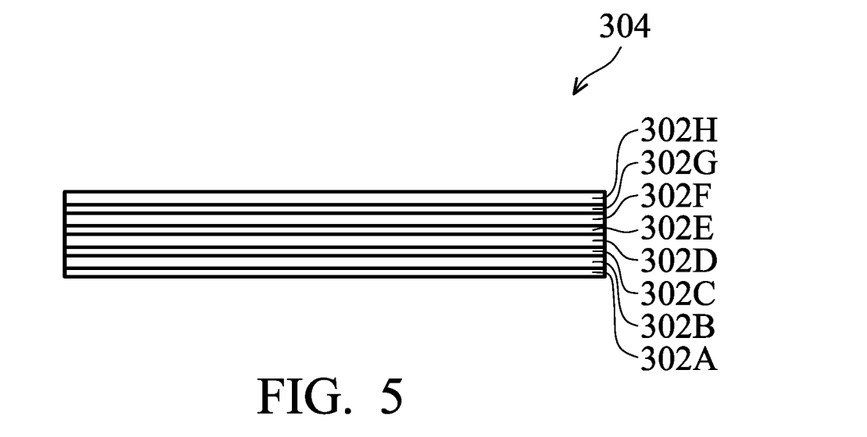
FIG. 5 is a cross-sectional view of a light-reflective element of a light-sensing device, in accordance with some embodiments.

FIG. 5 is a cross-sectional view of a light-reflective element of a light-sensing device, in accordance with some embodiments. In some embodiments, there are more than two pairs of dielectric layers in the light-reflective element 304. As shown in FIG. 5, the light-reflective element 304 further includes one or more parts of dielectric layers including dielectric layers 302E, 302F, 302G, and 302H. In some embodiments, the dielectric layers 302E and 302G are made of a material that is the same as that of the dielectric layer 302A or 302C. In some embodiments, the dielectric layer 302E or 302G is substantially as thick as the dielectric layer 302A or 302C. In some embodiments, the dielectric layers 302F and 302H are made of a material that is the same as that of the dielectric layer 302B or 302D. In some embodiments, the dielectric layer 302F or 302H is substantially as thick as the dielectric layer 302B or 302D.

Many variations and/or modifications can be made to embodiments of the disclosure. In some other embodiments, each dielectric layer in the light-reflective element 304 has substantially the same thickness.

Embodiments of the disclosure form a light-sensing device with light-reflective element. The light-reflective element includes a stack of multiple pairs of dielectric layers. Each of the pairs has a first dielectric layer and a second dielectric layer, and the first dielectric layer has a different refractive index than that of the second dielectric layer. Depending on the material or thickness of the dielectric layers of the light-reflective element, the light-reflective element is capable of reflecting light with a longer wavelength, such as red light, near IR light, or invisible light. A light-sensing region in a semiconductor substrate is positioned between the light-reflective element and a light-receiving surface of the semiconductor substrate. Therefore, light coming from the light-receiving surface may be sensed by the light-sensing region and then reflected by the light-reflective element. Therefore, the reflected light travels through the light-sensing region again and is sensed again by the light-sensing region. The quantum efficiency is improved accordingly.

In accordance with some embodiments, a light-sensing device is provided. The light-sensing device includes a semiconductor substrate and a light-sensing region in the semiconductor substrate. The light-sensing device also includes a light-reflective element over the semiconductor substrate. The light-sensing region is between the light-reflective element and a light-receiving surface of the semiconductor substrate. The light-reflective element includes a stack of multiple pairs of dielectric layers. Each of the pairs has a first dielectric layer and a second dielectric layer, and the first dielectric layer has a different refractive index than that of the second dielectric layer.

In accordance with some embodiments, a light-sensing device is provided. The light-sensing device includes a semiconductor substrate and a light-sensing region in the semiconductor substrate. The light-sensing device also includes a light-reflective element over the semiconductor substrate. The light-sensing region is between a light-receiving surface of the semiconductor substrate and the light-reflective element. The light-reflective element is a stack of dielectric layers capable of reflecting a red light or an invisible light. The light-sensing device further includes a conductive contact completely penetrating through the light-reflective element.

In accordance with some embodiments, a method for forming a light-sensing device is provided. The method includes forming a light-sensing region in a semiconductor substrate. The semiconductor substrate has a front surface and a light-receiving surface opposite to the front surface. The method also includes forming a first dielectric layer over the front surface. The method further includes forming a second dielectric layer over the first dielectric layer. The second dielectric layer has a different refractive index than that of the first dielectric layer. The first dielectric layer and the second dielectric layer together form a light-reflective element or part of a light-reflective element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a light-sensing device, comprising:
   forming a light-sensing region in a semiconductor substrate, wherein the semiconductor substrate has a front surface and a light-receiving surface opposite to the front surface;
   forming a gate stack over the semiconductor substrate;
   forming a first dielectric layer over the front surface, wherein the first dielectric layer is in direct contact with the gate stack;
   forming a second dielectric layer over the first dielectric layer, wherein the second dielectric layer has a different refractive index than that of the first dielectric layer, and the first dielectric layer and the second dielectric layer together form at least part of a light-reflective element;
   partially removing the first dielectric layer and the second dielectric layer to form a contact opening completely penetrating through the light-reflective element; and
   forming a conductive contact to at least partially fill the contact opening after the contact opening completely penetrating through the light-reflective element is formed.

2. The method for forming a light-sensing device as claimed in claim 1, wherein the conductive contact is formed to be in direct contact with the first dielectric layer and the second dielectric layer.

3. The method for forming a light-sensing device as claimed in claim 1, wherein the conductive contact is formed to completely fill the contact opening.

4. The method for forming a light-sensing device as claimed in claim 1, further comprising thinning the semiconductor substrate.

5. The method for forming a light-sensing device as claimed in claim 4, wherein the semiconductor substrate is thinned after the first dielectric layer and the second dielectric layer are formed.

6. The method for forming a light-sensing device as claimed in claim 5, wherein the semiconductor substrate is thinned after the conductive contact is formed.

7. The method for forming a light-sensing device as claimed in claim 1, wherein the light-reflective element is formed to be capable of reflecting a red light or an infrared (IR) light.

8. The method for forming a light-sensing device as claimed in claim 1, further comprising:
   forming a third dielectric layer over the second dielectric layer; and
   forming a fourth dielectric layer over the third dielectric layer, wherein the fourth dielectric layer has a different refractive index than that of the third dielectric layer, and the first, the second, the third, and the fourth dielectric layers together form at least part of the light-reflective element.

9. The method for forming a light-sensing device as claimed in claim 8, wherein the conductive contact is formed to penetrate through the third dielectric layer and the fourth dielectric layer.

10. The method for forming a light-sensing device as claimed in claim 1, wherein the conductive contact is formed to have a top surface that is substantially coplanar with a top surface of the light-reflective element.

11. A method for forming a light-sensing device, comprising:
    forming a light-sensing region in a semiconductor substrate;
    forming an insulating layer and a gate stack over the semiconductor substrate, wherein the insulating layer surrounds the gate stack, and a top surface of the insulating layer is substantially level with a top of a spacer element formed along a sidewall of the gate stack;
    forming a first dielectric layer directly on the insulating layer;
    forming a second dielectric layer over the first dielectric layer, wherein the second dielectric layer has a different refractive index than that of the first dielectric layer, and the first dielectric layer and the second dielectric layer together form at least part of a light-reflective element; and
    forming a conductive contact to completely penetrate through the first dielectric layer and the second dielectric layer and to reach the gate stack.

12. The method for forming a light-sensing device as claimed in claim 11, wherein the first dielectric layer has a greater refractive index than that of the insulating layer.

13. The method for forming a light-sensing device as claimed in claim 11, wherein the first dielectric layer and the second dielectric layer are formed to extend across opposite edges of the gate stack.

14. The method for forming a light-sensing device as claimed in claim 11, wherein the conductive contact is formed to be in direct contact with the first dielectric layer and the second dielectric layer.

15. The method for forming a light-sensing device as claimed in claim 11, wherein the first dielectric layer is formed to be in direct contact with the insulating layer and the gate stack.

16. A method for forming a light-sensing device, comprising:
    forming a light-sensing region in a semiconductor substrate;
    forming a gate stack over the semiconductor substrate;

forming a source/drain element at least partially in the semiconductor substrate;

forming an insulating layer to surround the gate stack and to cover the source/drain element, wherein a top surface of the insulating layer is substantially level with a top of a spacer element formed along a sidewall of the gate stack;

forming a first dielectric layer directly on the insulating layer;

forming a second dielectric layer over the first dielectric layer, wherein the second dielectric layer has a different refractive index than that of the first dielectric layer, and the first dielectric layer and the second dielectric layer together form at least part of a light-reflective element; and forming a conductive contact to completely penetrate through the second dielectric layer, the first dielectric layer and the insulating layer and to reach the source/drain element.

17. The method for forming a light-sensing device as claimed in claim 16, further comprising forming an insulating layer over the source/drain element and the light-sensing region before the first dielectric layer is formed.

18. The method for forming a light-sensing device as claimed in claim 17, wherein the conductive contact is formed to gradually becomes narrower along a direction from a top of the conductive contact to a bottom of the conductive contact.

19. The method for forming a light-sensing device as claimed in claim 17, wherein the conductive contact is formed to be in direct contact with the insulating layer, the first dielectric layer, and the second dielectric layer.

20. The method for forming a light-sensing device as claimed in claim 16, wherein the conductive contact is formed to be in direct contact with an interface between the first dielectric layer and the second dielectric layer.

* * * * *